United States Patent [19]
Mitcham et al.

[11] Patent Number: 5,247,180
[45] Date of Patent: Sep. 21, 1993

[54] STEREOLITHOGRAPHIC APPARATUS AND METHOD OF USE

[75] Inventors: Larry D. Mitcham, Temple; William E. Nelson, Dallas, both of Tex.

[73] Assignee: Texas Instruments Incorporated, Dallas, Tex.

[21] Appl. No.: 814,859

[22] Filed: Dec. 30, 1991

[51] Int. Cl.5 .............................................. B29C 35/08
[52] U.S. Cl. .................................. 250/492.1; 264/22; 425/174.4; 346/108; 346/160
[58] Field of Search ...................... 250/492.1; 264/22; 425/174, 174.4; 346/108, 160; 364/522; 356/121, 375

[56] References Cited

U.S. PATENT DOCUMENTS

| | | | |
|---|---|---|---|
| 5,011,635 | 4/1991 | Murphy et al. | 250/492.1 |
| 5,031,120 | 7/1991 | Pomerantz et al. | 364/468 |
| 5,049,901 | 9/1991 | Gelbart | 346/108 |
| 5,059,359 | 10/1991 | Hull et al. | 250/492.1 |
| 5,123,734 | 6/1992 | Spence et al. | 425/174.4 |
| 5,164,128 | 11/1992 | Modrek et al. | 250/492.1 |

OTHER PUBLICATIONS

3D Systems, Inc. brochure.

*Primary Examiner*—Paul M. Dzierzynski
*Assistant Examiner*—Kiet T. Nguyen
*Attorney, Agent, or Firm*—Julie L. Reed; James C. Kesterson; Richard L. Donaldson

[57] ABSTRACT

A stereolithographic apparatus is disclosed comprising a vat, a working surface in the vat, an elevating mechanism for controlling the level of liquid within the vat relative to the working surface, an illumination source for emitting radiation, and an area array deformable mirror device. The illumination source emits radiation which is operable to harden a stereolithographic liquid, while the deformable mirror device is operable to reflect the incident radiation onto the surface of the liquid. The deformable mirror device can harden an entire lamina of liquid in one brief exposure interval increasing throughout without sacrificing resolution.

16 Claims, 3 Drawing Sheets

STEREOLITHOGRAPHIC APPARATUS AND METHOD OF USE

TECHNICAL FIELD OF THE INVENTION

This invention relates in general to electro-optical devices, and, more particularly, to a stereolithographic apparatus and method of use.

BACKGROUND OF THE INVENTION

Stereolithography is a process by which three dimensional objects are fabricated from thin layers of hardened or cured liquid polymers. The liquid polymers or resins are selectively hardened by an intense light source of suitable wave length. Typically, an ultraviolet ("UV"), argon-ion, or other type of laser is used to harden the liquid polymer. The particular laser is directed to a thin film of the polymer by an x-y scanner interpreting, typically, computer-aided design ("CAD") data. The CAD data mathematically represents the shape of the object to be produced as a series of sequential thin layers of laminas, typically 1/100th of an inch in thickness. The object may thereby be produced by curing portions of a film of resin that correspond to the first layer of the object, by coating the hardened layer with a uniform thin liquid film, and by curing portions of the second film that correspond to the next lamina of the object. This process is repeated until each lamina of the model has been reproduced as a layer of hardened polymer. The model produced by stereolithography may be used for testing and evaluation of engineering designs, for tooling purposes and for low volume manufacturing applications.

Known stereolithographic process devices and methods are limited by at least two characteristics. First, the use of an x-y scanner limits the speed by which a laser beam may be scanned on to a film of liquid resin to approximately 55 inches per second. This speed, coupled with the high vertical resolution of the process, results in lengthy production time and low product output. Second, the use of a particular laser as the illumination source limits the type of liquid resin that may be used in the system. Each resin has an individual reaction to various wavelengths of electromagnetic radiation. Typically, each resin may be hardened by only one type of laser. This results in little or no ability to change the resin composition without expensive hardware changes. Also, not all wavelengths of radiation may be produced as laser light. This precludes the use of certain resins because no laser exists to cure them.

Therefore, a need has arisen for a stereolithographic apparatus which allows for high product output and which is compatible with a wider range stereolithographic resins.

SUMMARY OF THE INVENTION

In accordance with the present invention, a stereolithographic apparatus is provided which substantially eliminates or reduces disadvantages and problems associated with prior stereolithographic systems.

A stereolithographic apparatus is disclosed comprising a vat for receiving a stereolithographic liquid, a working surface within the vat, an elevating mechanism for controlling the level of the liquid in the vat, an illumination source for emitting radiation, and a deformable mirror device. The illumination source emits radiation which is operable to harden the liquid, while the deformable mirror device is operable to reflect the incident radiation onto the surface of the liquid.

The first technical advantage of the disclosed invention is its speed. The plurality of mirrors which comprise the deformable mirror device allow an entire layer of resin to be hardened in one exposure interval. This technique allows much greater throughput.

A second technical advantage of the device is its flexibility. Almost any illumination source may be used with the deformable mirror device. The illumination source can therefore be tailored to the particular resin so used and may, in fact, be an inexpensive incandescent light bulb.

A third technical advantage of the disclosed invention is its cost. Deformable mirror devices are currently available in mass produced quantities at costs far below that of an x-y laser scanner.

Another technical advantage of the invention is its suitability to large model fabrication. Multiple exposure heads may be combined to cure a large layer of a liquid or a single exposure head may be positioned to cure the same large area in a few exposure intervals. Resolution will meanwhile remain high.

BRIEF DESCRIPTION OF THE DRAWINGS

For a more complete understanding of the present invention and the advantages thereof, reference is now made to the following description taken in conjunction with the accompanying drawings in which.

DETAILED DESCRIPTION OF THE INVENTION

Figure 1A:
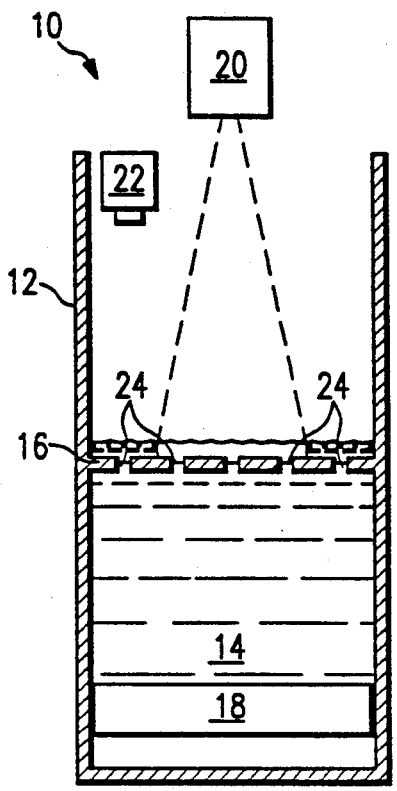
FIGS. 1a through 1e illustrate one sequence of steps for producing a model using the stereolithographic process.

The preferred embodiment of the present invention and its advantages are best understood by referring to FIGS. 1 through 4 of the drawings, like numerals being used for like and corresponding parts of the various drawings.

FIGS. 1a through 1e illustrate one sequence of steps for producing a model using the stereolithographic process.

(a) Stereolithographic apparatus ("SLA") 10 comprises vat 12 for receiving a stereolithographic liquid 14, a working surface 16, an elevator 18 for controlling the level of the liquid relative to the working surface 16, and an exposure head 20 for curing selected portions of the resin as will be described more fully below. The stereolithographic liquid may be a resin or a polymer, as is well known to those skilled in the art. SLA 10 may also comprise a liquid applicator 22 for ensuring a uniform liquid thickness at each modeling stage.

In operation, a thin film of liquid is applied to working surface 16 by, for instance, raising elevator 18 within vat 12. Elevator 18 will cause liquid 14 to rise through perforations 24 to form a thin film on working surface 16. Exposure head 20 then cures selected portions of the liquid film by directing electromagnetic radiation thereto. Exposure head 20 is controlled by circuitry (shown in FIG. 2) that interprets data of the object to be so modeled. The data represents the object as a series of thin sequential layers or laminas which, when stacked on top of each other form the complete object. Typically, computer-aided design ("CAD") data may be most easily converted into sequential layers or laminas of the model to be produced.

(b) Elevator 18 again rises to cause liquid 14 to cover the previously cured layer 26 ("workpiece") resting on working surface 26 with a second film of liquid. This second layer of liquid will cover both the cured and uncured portions of the first layer. Applicator 22 may also spray a small amount of liquid onto workpiece 26 to ensure uniform film coverage of the workpiece 26. Each film is approximately one 1/100th of an inch thick.

(c) Exposure head 26 cures the second layer of liquid applied in FIG. 1b as described in connection with FIG. 1a.

Figure 1B:
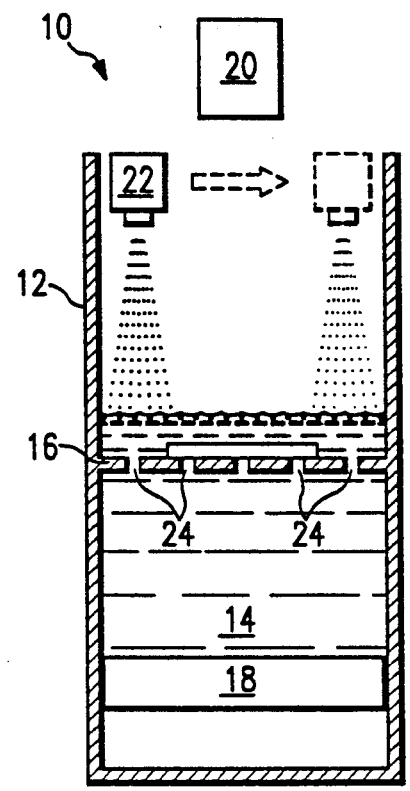
Figure 1C:
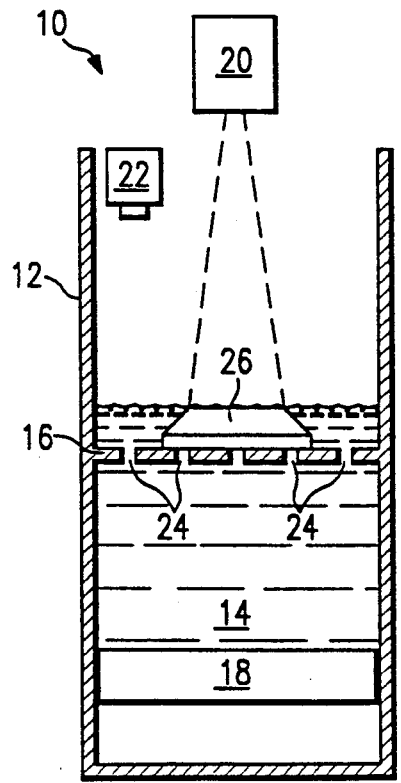
Figure 1D:
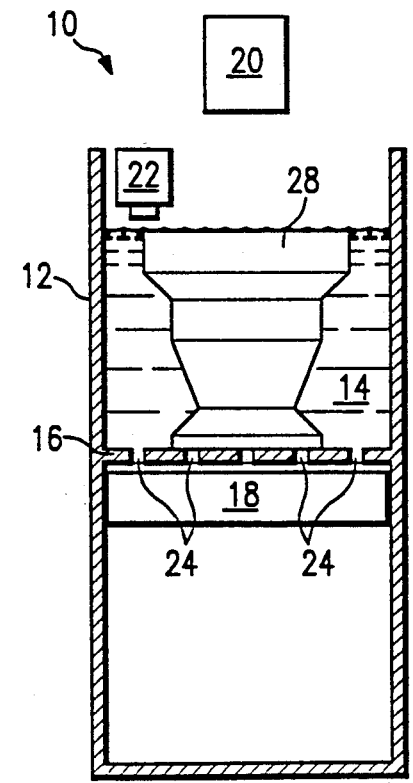
Figure 1E:
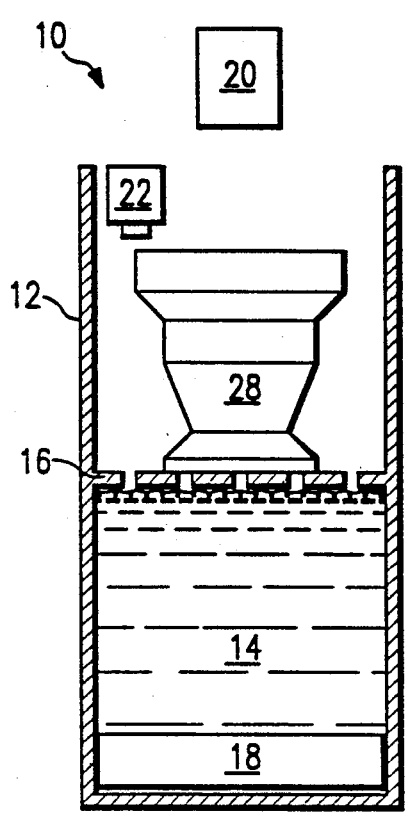

(d) The steps in FIGS. 1a through 1c are then repeated until the entire part 28 has been produced.

(e) Complete part 28 may then be removed from SLA 10. Under certain conditions using certain liquids, it may be necessary to cure part 28 in an oven (not shown) prior to its use.

An SLA, similar to that depicted in FIGS. 1a through 1e, may be purchased from 3D Systems, Inc. of Valencia, Calif. or from Quadrax Laser Technologies, Inc. of Portsmouth, R.I. The 3D Systems' SLA employs a HeCd laser with a wavelength of 325 nm. The 3D System differs from the process described above. It successively lowers the working surface below the surface of liquid instead of raising the liquid relative to the working surface. There, the formed object is slowly submerged as it is produced on the surface of the liquid. The Quadrax Laser Technologies' SLA uses an argon-ion visible light laser in the process described in connection with FIGS. 1a-1c. Other SLA designers use ultraviolet ("UV") lasers to harden stereolithographic liquids.

Figure 2:
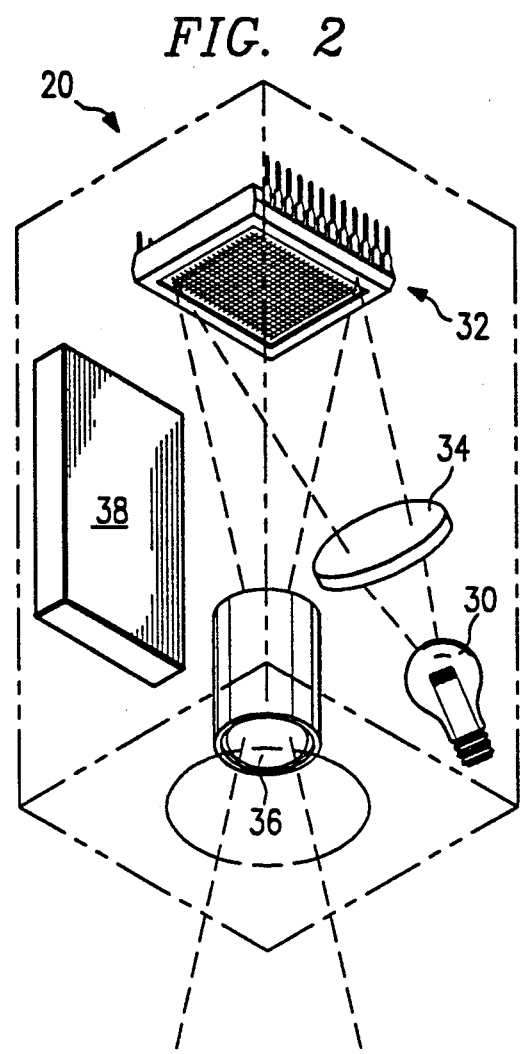
FIG. 2 is a partially perspective, partially schematic illustration of an exposure head containing one embodiment of the disclosed invention for use in the process depicted in FIGS. 1a through 1e.

FIG. 2 is a partially perspective, partially schematic illustration of an exposure head 20 containing one embodiment of the disclosed invention for use in the process depicted in FIGS. 1a through 1e. The exposure head 20 comprises an illumination source 30 an area array deformable mirror device ("DMD") 32, two lenses 34 and 36, and control circuitry 38. Illumination source 30 emits radiation that is operable to harden a particular SLA liquid. Lens 34 more uniformly illuminates DMD 32 than would otherwise occur without it. Lens 36 focuses and magnifies the light reflected off of DMD 32 onto the working surface 16 (shown in FIGS. 1a-1e). DMD 32 is an electro-optical device containing a regular n×m array of mirrors manufactured by Texas Instruments, Inc. of Dallas, Tex. Each mirror may be electronically controlled to reflect incident radiation along one of a plurality of optical pathways. In the preferred embodiment, DMD 32 comprises a matrix of bistable mirrors, i.e., there are two optical pathways for each mirror. Illumination source 30, DMD 32, and lenses 34 and 36 are positioned such that light impinging upon DMD 32 from illumination source 30 may be focused onto a thin film of SLA resin if, and only if, one of the two optical pathways is selected. The optical pathway of radiation emitted from illumination source 30 is depicted by the converging and diverging dashed lines. Each bistable mirror on DMD 32 is controlled by circuitry 38 which interprets data from a processor (not shown). Circuitry 38 may be located elsewhere or may be integrated completely with a standalone processor. Illumination source 30 may be tailored to the individual stereolithographic liquid used in the SLA process and might be an ordinary tungsten-halogen incandescent light bulb or any number of visible or non-visible light lasers.

Figure 3:
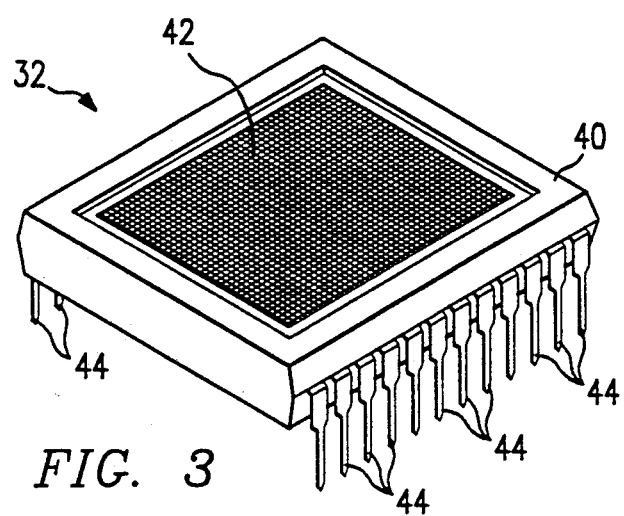
FIG. 3 depicts perspectively an area array deformable mirror device useful in the exposure head of FIG. 2.

FIG. 3 depicts perspectively an area array deformable mirror device 32 illustrated in the exposure head 20 of FIG. 2. DMD 32 comprises a body 40 having a planar active surface 42 and a number of electrical pins 44. The active surface 42 of DMD 32 may contain an n×m matrix of individually addressable bistable mirrors. Each mirror is typically a square or diamond having sides of 12 to 20 microns. This small size allows a single DMD having a footprint of approximately 2 square inches to have over 2 million individually addressable mirrors in, for instance, a 1920×1080 matrix. This small mirror size allows exposure head 20 (shown in FIG. 2) to cure a 4×8 square inch area in a single exposure interval with the same resolution as achieved by prior x-y scanner/laser exposure head combinations. Typically, these prior exposure heads achieve resolutions of ±0.005 inches. In such a case, lens 36 of FIG. 2 would also magnify the image of DMD 32 by a factor of 4x-6x.

Figure 4:
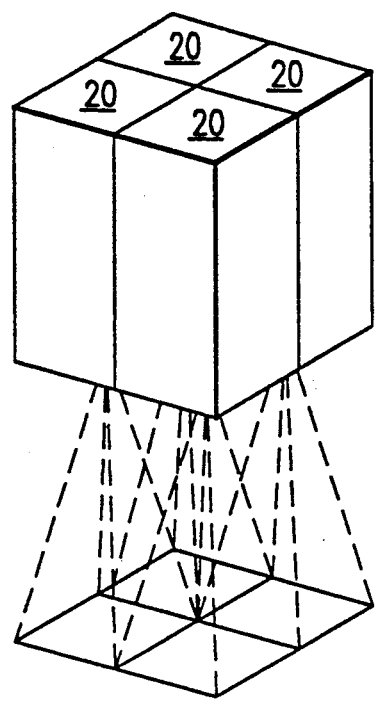
FIG. 4 depicts schematically how the exposure head of FIG. 2 may be combined with similar exposure heads to increase possible model size.

FIG. 4 depicts how multiple exposure heads 20 may be combined or "tiled" to cover an area of, for instance, 8×16 square inch. This allows the user to maintain the same high degree of resolution described in connection with FIG. 3. In such a tiled configuration, each exposure head 20 cures one quadrant of the film resin. Each quadrant exposes a 4×8 square inch area. Any number of exposure heads 20 can be combined to increase maximum model size.

Figure 5:
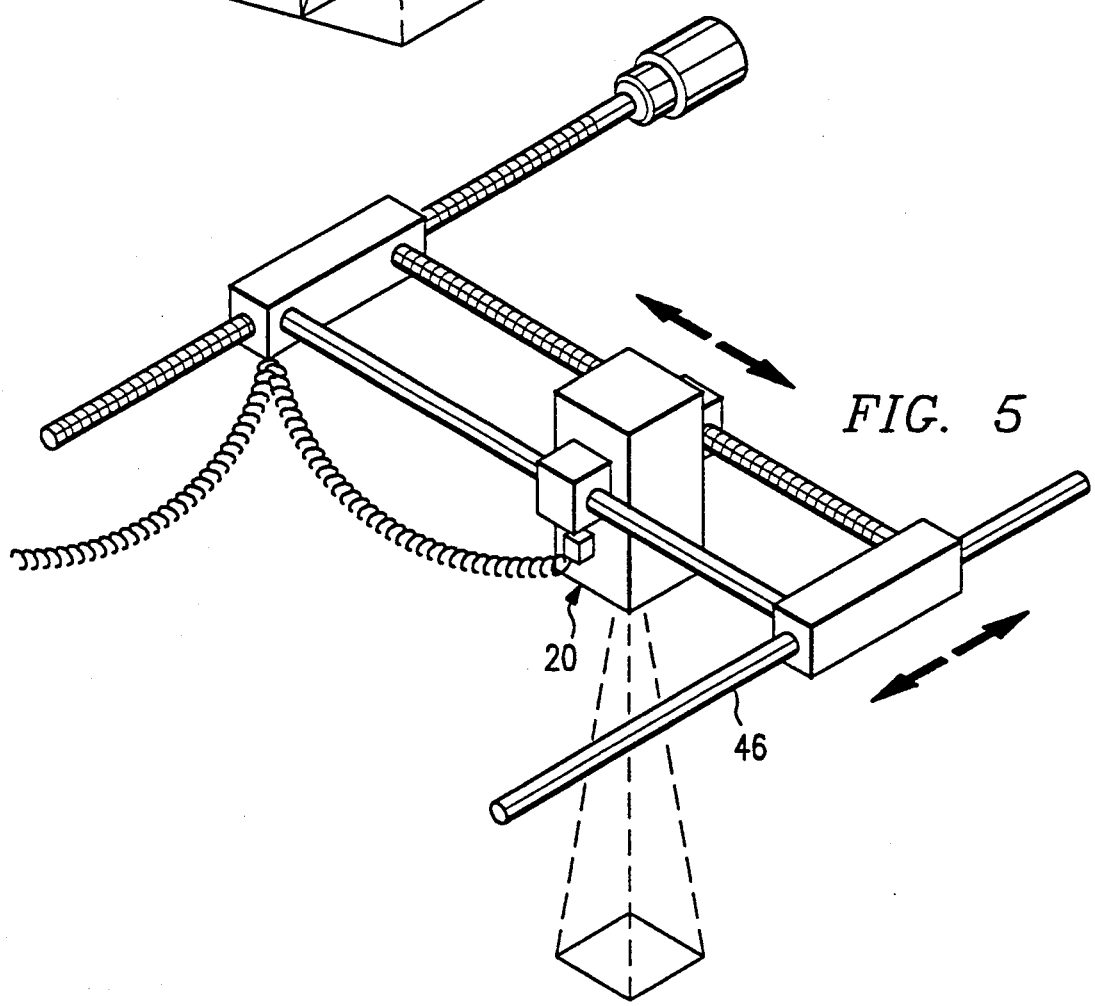
FIG. 5 depicts perspectively how the exposure head of FIG. 2 may be articulated to cure a larger film size.

FIG. 5 depicts how a single exposure head 20 may be mounted on a positioning device 46 with freedom of movement in two dimensions. The single exposure head 20 may thereby be made to cure a lamina of resin larger in size than the projected image of DMD 32 (FIGS. 2 and 3). This allows the user to maintain the same high degree of resolution described in connection with FIG. 3. Positioning devices used in lithographic processes are known in the art to have resolutions comparable with the SLA process. These positioning devices are used to align photomasks with silicon wafers in the production of devices such as integrated circuits.

Although the present invention has been described in detail, it should be understood that various changes, substitutions and operations can be made hereto without departing from the spirit and scope of the invention as defined by the appended claims.

What is claimed is:

1. A stereolithographic apparatus comprising:
   a vat for receiving a stereolithographic liquid;
   a working surface within the vat;
   an elevating mechanism for controlling the level of the liquid in the vat relative to the working surface; and
   at least one exposure head, each exposure head comprising an illumination source for emitting radiation, the radiation operable to harden the liquid, and an area array deformable mirror device responsive to applied signals for selectively reflecting the radiation to form an image on the surface of the liquid, wherein said exposure head is movable in two dimensions.

2. The stereolithographic apparatus of claim 1 further comprising a lens for magnifying the image of the area array deformable mirror device.

3. The stereolithographic system of claim 1 further comprising a positioner for moving the exposure head in two dimensions.

4. The stereolithographic apparatus of claim 3 further comprising a lens for magnifying the image of the area array deformable mirror device.

5. The stereolithographic apparatus of claim 1 wherein the elevator raises the liquid relative to the working surface.

6. The stereolithographic apparatus of claim 1 wherein the elevator lowers the working surface into the liquid.

7. The stereolithographic apparatus of claim 1 wherein the liquid is a resin containing a photoactive agent.

8. The stereolithographic exposure head of claim 1 wherein the liquid is a polymer containing a photoactive agent.

9. A stereolithographic exposure head for use with a stereolithographic apparatus, the exposure head comprising:

a plurality of mirrors individually responsive to input signals, the mirrors operable to reflect incident radiation along a plurality of optical pathways, the mirrors forming a $n \times m$ matrix;

an illumination source for emitting radiation incident upon the mirrors, the radiation operable to harden a stereolithographic liquid;

control circuitry responsive to input data operable to select one of the plurality of pathways along which each of the mirrors will reflect incident radiation to form an image, wherein said data selecting one of the pathways forms a cross-sectional image.

10. The stereolithographic exposure head of claim 9 wherein said plurality of pathways comprise two pathways.

11. The stereolithographic exposure head of claim 9 further comprising a lens for magnifying the image of the plurality of mirrors.

12. The stereolithographic exposure head of claim 9 further comprising a positioner for moving the head in two dimensions.

13. A method of forming a model of cured resin comprising the steps of:

applying a thin film of stereolithographic liquid to a surface;

illuminating a plurality of deformable mirrors with radiation operable to cure the liquid resin; and deflecting certain of the mirrors such that a portion of the radiation is directed to the film of liquid, the directed radiation curing a portion of the resin, the portion of the resin forming at least part of a lamina of the model; and repeating said steps to form said model in successive layers.

14. The method of claim 13 further comprising the step of sequentially repeating the applying, illuminating and deflecting steps until the sequence of laminas forms the model.

15. The method of claim 13 further comprising the steps of:

moving the plurality of deformable mirrors with respect to the thin film; and curing the uncured portions of the lamina of the model.

16. The method of claim 15 further comprising the step of sequentially repeating the applying, illuminating, deflecting, moving and curing steps until the sequence of lamines forms the model.

* * * * *